(12) United States Patent
Takeuchi et al.

(10) Patent No.: US 9,716,209 B2
(45) Date of Patent: Jul. 25, 2017

(54) METHOD OF MANUFACTURING N-P-N NITRIDE-SEMICONDUCTOR LIGHT-EMITTING DEVICE, AND N-P-N NITRIDE-SEMICONDUCTOR LIGHT-EMITTING DEVICE

(71) Applicant: MEIJO UNIVERSITY, Nagoya-shi, Aichi (JP)

(72) Inventors: Tetsuya Takeuchi, Nagoya (JP); Yuka Kuwano, Yokohama (JP); Motoaki Iwaya, Nagoya (JP); Isamu Akasaki, Nagoya (JP)

(73) Assignee: MELIO UNIVERSITY, Nagoya-shi (JP)

( * ) Notice: Subject to any disclaimer, the term of this patent is extended or adjusted under 35 U.S.C. 154(b) by 0 days.

(21) Appl. No.: 15/244,763

(22) Filed: Aug. 23, 2016

(65) Prior Publication Data
US 2016/0365479 A1    Dec. 15, 2016

Related U.S. Application Data

(63) Continuation of application No. PCT/JP2015/054975, filed on Feb. 23, 2015.

(30) Foreign Application Priority Data

Feb. 26, 2014    (JP) ................................. 2014-035192

(51) Int. Cl.
| | |
|---|---|
| H01L 33/04 | (2010.01) |
| H01L 33/14 | (2010.01) |
| H01L 33/00 | (2010.01) |
| H01L 33/32 | (2010.01) |

(52) U.S. Cl.
CPC ............ *H01L 33/04* (2013.01); *H01L 33/007* (2013.01); *H01L 33/14* (2013.01); *H01L 33/0075* (2013.01); *H01L 33/32* (2013.01)

(58) Field of Classification Search
CPC ...... H01L 33/0075; H01L 33/04; H01L 33/14
See application file for complete search history.

(56) References Cited

U.S. PATENT DOCUMENTS

| | | | | |
|---|---|---|---|---|
| 5,936,266 A | * | 8/1999 | Holonyak, Jr. | ......... H01L 33/30 257/106 |
| 6,760,357 B1 | * | 7/2004 | Boucart | .................. H01S 5/426 257/104 |

(Continued)

FOREIGN PATENT DOCUMENTS

| | | |
|---|---|---|
| JP | 2008-226906 A | 9/2008 |
| JP | 2009-272316 A | 11/2009 |

(Continued)

OTHER PUBLICATIONS

Jeon et al., "GaN Tunnel Junction as a Current Aperture in a Blue Surface-Emitting Light-Emitting Diode," Applied Physics Letters, vol. 80, No. 11, pp. 1933-1935, 2002.

(Continued)

*Primary Examiner* — Michele Fan
(74) *Attorney, Agent, or Firm* — Oliff PLC

(57) ABSTRACT

This application provides a method of manufacturing an n-p-n nitride-semiconductor light-emitting device which includes a current confinement region (A) using a buried tunnel junction layer and in which a favorable luminous efficacy can be obtained and to provide the n-p-n nitride-semiconductor light-emitting device. The p-type activation of a p-type GaN crystal layer stacked below a tunnel junction layer is performed in an intermediate phase of a manufacturing process in which the p-type GaN crystal layer is exposed to atmosphere gas with the tunnel junction layer partially removed, before the tunnel junction layer is buried in an n-type GaN crystal layer. In the intermediate phase of the manufacturing process in which the p-type GaN crystal layer is exposed, p-type activation is efficiently performed on the p-type GaN crystal layer, and a p-type GaN crystal layer with low electric resistance can be obtained.

5 Claims, 7 Drawing Sheets

(56) References Cited

U.S. PATENT DOCUMENTS

| | | | | |
|---|---|---|---|---|
| 2004/0051113 A1* | 3/2004 | Chang | ................... | B82Y 20/00 |
| | | | | 257/104 |
| 2004/0218655 A1* | 11/2004 | Tandon | ................ | H01S 5/3095 |
| | | | | 372/96 |
| 2005/0083979 A1* | 4/2005 | Leary | ................... | B82Y 20/00 |
| | | | | 372/43.01 |
| 2006/0078029 A1* | 4/2006 | Amann | ................ | B82Y 20/00 |
| | | | | 372/64 |
| 2006/0126687 A1* | 6/2006 | Amann | ................... | H01S 5/18 |
| | | | | 372/43.01 |
| 2007/0201523 A1* | 8/2007 | Walter | ................... | H01L 33/04 |
| | | | | 372/43.01 |
| 2008/0217646 A1 | 9/2008 | Komada | | |
| 2011/0220871 A1 | 9/2011 | Kamikawa et al. | | |
| 2012/0315719 A1* | 12/2012 | Ando | ................... | H01L 33/22 |
| | | | | 438/47 |

FOREIGN PATENT DOCUMENTS

| | | |
|---|---|---|
| JP | 2011-096964 A | 5/2011 |
| WO | 2010/027016 A1 | 3/2010 |

OTHER PUBLICATIONS

May 19, 2015 International Search Report issued in International Patent Application No. PCT/JP2015/054975.

Sep. 9, 2016 International Preliminary Report on Patentability issued in International Patent Application No. PCT/JP2015/054975.

* cited by examiner

METHOD OF MANUFACTURING N-P-N NITRIDE-SEMICONDUCTOR LIGHT-EMITTING DEVICE, AND N-P-N NITRIDE-SEMICONDUCTOR LIGHT-EMITTING DEVICE

CROSS-REFERENCE TO RELATED APPLICATIONS

This application is based upon and claims the benefit of priority of the prior Japanese Patent Application No. 2014-035192, filed on Feb. 26, 2014, the entire contents of which are incorporated herein by reference.

FIELD

The present invention relates to a method of manufacturing a nitride semiconductor light-emitting device and a nitride semiconductor light-emitting device, and particularly to a method of manufacturing an n-p-n nitride-semiconductor light-emitting device including a current confinement structure and an n-p-n nitride-semiconductor light-emitting device.

BACKGROUND

Conventionally, a nitride semiconductor light-emitting device constituting a vertical light-emitting diode, a surface-emitting laser, or the like has included a current confinement structure. A vertical nitride semiconductor light-emitting device has a basic structure in which an active layer, a p-type nitride semiconductor layer, and a positive electrode are stacked in that order on an n-type nitride semiconductor layer and in which a negative electrode is fainted on the n-type nitride semiconductor layer. This is a configuration in which light emitted in response to a current being passed from a p-type nitride semiconductor to an n-type nitride semiconductor is extracted toward an upper portion of the stack. Without a current confinement structure, a current in the p-type nitride semiconductor layer flows mainly through a region directly under the positive electrode. This is because a current flows along a shortest current path from the p-type nitride semiconductor to the active layer. Light emitted in the active layer, mainly in the region directly under the positive electrode in which a current is concentrated, is blocked by the positive electrode or absorbed by the positive electrode, and the amount of light that exits to the outside of the vertical nitride semiconductor light-emitting device decreases.

Accordingly, a technique has been devised in which a current path is structurally bent so that a reached position of a current in the active layer may be concentrated at a position shifted from the region directly under an electrode. Such a structure is called a current confinement structure. For example, a configuration is employed in which the positive electrode is formed in the shape of a ring so that a current may be confined inside the ring. Light emitted in the active layer is concentrated inside the ring, and exits to the outside along a central axis of the ring. At this time, the light is not obstructed by the ring-shaped positive electrode, and exits to the outside through the inside of the ring. In this case, a configuration has been proposed in which both of a current path from the positive electrode toward the central axis of the ring and a current path passing through the central axis of the ring and a region thereround toward the active layer have low resistance.

As one example, a nitride-semiconductor light-emitting diode including a buried tunnel junction is described in non-patent document 1. A tunnel junction is a junction relating to a tunnel diode having negative resistance characteristics, which is known as a so-called Esaki diode or the like. With the tunnel junction, unlike rectifying characteristics exhibited by general diodes, a current can be reversely passed from an n layer to a p layer, current-voltage characteristics thereof are ohmic like. For the utilization of the ohmic characteristics in the reverse direction, a tunnel junction having an n-type semiconductor layer on a positive electrode side and a p-type semiconductor layer on a negative electrode side is disposed in a current path inside the ring of the positive electrode. A current is concentrated at the tunnel junction and flows by the tunnel effect. At this time, with the tunnel junction, an n-type semiconductor layer is provided as a layer below the positive electrode instead of the p-type semiconductor layer to reduce the resistance of a current path from the positive electrode toward the central axis of the ring.

The activation of the p-type nitride semiconductor is performed by thermal annealing. Generally, a p-type GaN crystal used as a p-type nitride semiconductor is configured using, for example, Mg atoms or the like as acceptor impurities. Hydrogen atoms produced in a manufacturing process has the property of being taken into the crystal and easily combined with Mg atoms. If Mg atoms are combined with hydrogen atoms, Mg atoms are deactivated and may not function as acceptors. As a result, the GaN crystal may not behave as p-type to lose conductivity and may come to have high resistance. Thermal annealing breaks bonds between hydrogen atoms and Mg atoms and allows hydrogen atoms to exit to the outside of the crystal. This activates Mg atoms as acceptors, and a p-type GaN crystal having conductivity can be obtained. It is mentioned that the thermal annealing is performed in a phase after the formation of the element structure of the light-emitting diode and before the formation of the electrode in the manufacturing process.

Non-Patent Document 1: S. R. Jeon, et al., "GaN tunnel junction as a current aperture in a blue surface-emitting light-emitting diode," Applied Physics Letter, (U.S.), Jan. 14, 2002, Vol. 80, Number 11, pp. 1933-1935

SUMMARY

A method of manufacturing an n-p-n nitride-semiconductor light-emitting device according to an aspect of the embodiments is a method of manufacturing an n-p-n nitride-semiconductor light-emitting device which includes a current confinement structure using a buried tunnel junction layer including a first n-type nitrided compound layer. The method includes stacking a buried tunnel junction layer above a p-type nitrided compound layer, removing the buried tunnel junction layer while a region in which a current is confined and through which the current flows is being left, performing p-type activation on the p-type nitrided compound layer including a region directly under the buried tunnel junction layer, and stacking a second n-type nitrided compound layer to bury the buried tunnel junction layer.

Moreover, an n-p-n nitride-semiconductor light-emitting device according to an another aspect of the embodiments is an n-p-n nitride-semiconductor light-emitting device including a current confinement structure. An active layer, a p-type nitrided compound layer, and a buried tunnel junction layer including a first n-type nitrided compound layer are stacked in that order. The buried tunnel junction layer is stacked above the p-type nitrided compound layer to form a current path in which a current is confined. In the p-type nitrided compound layer, the concentration of hydrogen atoms contained in the region directly under the buried tunnel junction layer is lower than the concentration of hydrogen atoms contained in other region.

The object and advantages of the invention will be realized and attained by means of the devices and combinations particularly pointed out in the claims.

It is to be understood that both the forgoing general description and the following detailed description are exemplary and explanatory and are not restrictive of the invention.

BRIEF DESCRIPTION OF DRAWINGS

FIG. 7A is for a light-emitting region mesa diameter of 10 μm, FIG. 7B is for 15 μm, and FIG. 7C is for 20 μm.

DESCRIPTION OF EMBODIMENTS

It is indicated that the light-emitting diode fabricated in non-patent document 1 starts emitting light only if an injection current reaches or exceeds 2 kA/cm$^2$. A phenomenon is confirmed in which effective light emission cannot be obtained for an injection current of not more than that value. This phenomenon indicates that a region through which a current can easily flow is formed in a region other than a current confinement region and that a leakage current flows therethrough. One possible cause of a leakage current is the influence of thermal annealing. Since thermal annealing is performed after the element structure of the light-emitting diode is formed, the entire surface of the p-type nitride semiconductor layer is activated. Specifically, the p-type GaN crystal is activated not only in a region through which a current is originally desired to be passed, the region being located inside the ring in which a current is confined, but also in a region in which a current is not desired to be passed, the region being located directly under and outside the ring. Thus, the p-type GaN crystal has conductivity even in the region without a tunnel junction which is located directly under and outside the ring, and an injection current may leak.

Prior-art manufacturing methods such as described in non-patent document 1 or the like have the problem that in a current confinement structure using a buried tunnel junction, a luminous efficacy decrease may be caused by the presence of a current which is not confined in a buried tunnel junction region existing inside a positive electrode, such as a leakage current outside a current confinement region.

A technique disclosed in the present application is proposed in view of the above-described problem, and an object thereof is to provide a method of manufacturing an n-p-n nitride-semiconductor light-emitting device which includes a current confinement structure using a buried tunnel junction and in which a favorable luminous efficacy can be obtained and to provide the n-p-n nitride-semiconductor light-emitting device.

In a first embodiment, a nitride-semiconductor light-emitting diode including a buried tunnel junction will be described. First, a manufacturing process will be described. FIGS. 1 to 4 depict cross-sectional structures for respective phases of the manufacturing process. The nitride-semiconductor light-emitting diode has a structure in which nitride semiconductor layers are stacked on a GaN crystal substrate 100. The GaN crystal substrate 100 is a substrate obtained by forming a GaN crystal layer on a sapphire substrate with a low-temperature-deposited buffer layer interposed therebetween. Moreover, the formation of each nitride semiconductor layer on the GaN crystal substrate 100 is performed by metalorganic chemical vapor deposition (hereinafter abbreviated to MOCVD).

Figure 1:
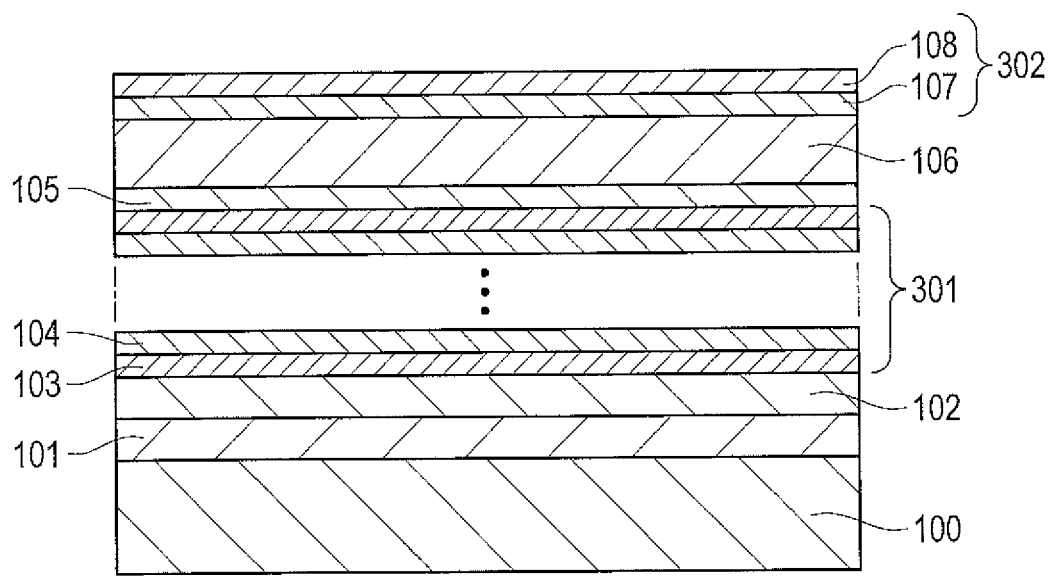
FIG. 1 is a view depicting a cross-sectional structure of a nitride-semiconductor light-emitting diode of a first embodiment in a first phase of a manufacturing process.

First, the cross-sectional structure in the first phase of the manufacturing process depicted in FIG. 1 will be described. The GaN crystal substrate 100 having a Ga plane on a surface thereof is set in a reacting furnace of an MOCVD system. After that, by increasing temperature while causing hydrogen gas and ammonia gas to flow into the reacting furnace, thermal cleaning for cleaning the surface of the GaN crystal substrate 100 is performed. Then, after the substrate temperature is increased to a high temperature of, for example, 1050° C. or the like, TMGa (trimethylgallium) and ammonia gas as raw materials are fed into the reacting furnace with hydrogen gas as carrier gas to grow an undoped GaN crystal layer 101, which is oriented with the +c axis and not doped with impurities, on the GaN crystal substrate 100 to, for example, approximately 2 μm. Subsequently, SiH$_4$ (silane) gas is additionally fed into the reacting furnace as a raw material gas to grow a lower n-type GaN crystal layer 102 on the undoped GaN crystal layer 101 to, for example, approximately 2 μm. The SiH$_4$ gas is a raw material gas for using Si atoms as n-type impurities. The impurity concentration is set to, for example, approximately 5×10$^{18}$ cm$^{-3}$.

Then, the carrier gas is changed from hydrogen gas to nitrogen gas while the growth temperature is being lowered to 780° C. After the substrate temperature is stabilized, TMGa, TMIn (trimethylindium), and ammonia gas as raw materials are fed into the reacting furnace to grow a GaInN crystal layer 103 on the lower n-type GaN crystal layer 102 to, for example, approximately 2.5 nm. Subsequently, TMGa gas and ammonia gas as raw material gases are fed into the reacting furnace to grow a GaN crystal layer 104 on the GaInN crystal layer 103 to, for example, approximately 10 nm. After that, the formation of the GaInN crystal layer 103 and the formation of the GaN crystal layer 104 are alternately repeated to form five pairs of layers, each pair including the GaInN crystal layer 103 and the GaN crystal layer 104. This is a quantum well active layer 301.

Subsequently, TMAl (trimethylaluminum), TMGa, CP$_2$Mg (cyclopentadienyl magnesium), and ammonia gas as raw materials are fed into the reacting furnace to grow a p-type AlGaN crystal layer 105 on the quantum well active layer 301 to, for example, approximately 20 nm. The CP$_2$Mg is a raw material for using Mg atoms as p-type impurities. The impurity concentration is set to, for example, approximately $2\times10^{19}$ cm$^{-3}$.

Then, the carrier gas is changed from nitrogen gas to hydrogen gas while the growth temperature is being increased to 1000° C. After that, TMGa, CP$_2$Mg, and ammonia gas as raw materials are fed into the reacting furnace to grow a p-type GaN crystal layer 106 on the p-type AlGaN crystal layer 105 to, for example, approximately 60 nm. The impurity concentration of Mg atoms as p-type impurities is set to, for example, approximately $2\times10^{19}$ cm$^{-3}$.

Subsequently, the carrier gas is changed from hydrogen gas to nitrogen gas while the growth temperature is being lowered to 760° C. After the substrate temperature is stabilized, TMGa, TMIn, CP$_2$Mg, and ammonia gas as raw materials are fed into the reacting furnace to grow a high-concentration p-type GaInN crystal layer 107 on the p-type GaN crystal layer 106 to, for example, approximately 3 nm. The impurity concentration of Mg atoms as p-type impurities is preferably, for example, approximately $5\times10^{19}$ cm$^{-3}$-$1\times10^{21}$ cm$^{-3}$, more preferably approximately $1\times10^{20}$ cm$^{-3}$-$3\times10^{20}$ cm$^{-3}$.

Then, TMGa gas, SiH$_4$ gas, and ammonia gas as raw material gases are fed into the reacting furnace to grow a high-concentration n-type GaN crystal layer 108 (first n-type nitrified compound layer) on the high-concentration p-type GaInN crystal layer 107 to, for example, approximately 7.5 nm. The impurity concentration of Si atoms as n-type impurities is preferably, for example, approximately $1\times10^{20}$ cm$^{-3}$-$1\times10^{21}$ cm$^{-3}$, more preferably approximately $3\times10^{20}$ cm$^{-3}$-$6\times10^{20}$ cm$^{-3}$.

The high-concentration p-type GaInN crystal layer 107 and the high-concentration n-type GaN crystal layer 108 form a tunnel junction layer 302. In the following explanation, a stacked structure depicted in FIG. 1 may be referred to as a wafer.

The tunnel junction layer 302 is a p-n junction which exhibits characteristics such as in a so-called Esaki diode. Specifically, a current flows in a reverse direction of the p-n junction in a low-resistance state from a reverse bias voltage having a small voltage value, and characteristics such as in a low-resistance element are exhibited. In the nitride-semiconductor light-emitting diode, a low-resistance region is formed in a region provided with the tunnel junction layer 302. In other regions, a current is blocked in reverse bias as in rectifying characteristics of a general p-n junction.

Figure 2:
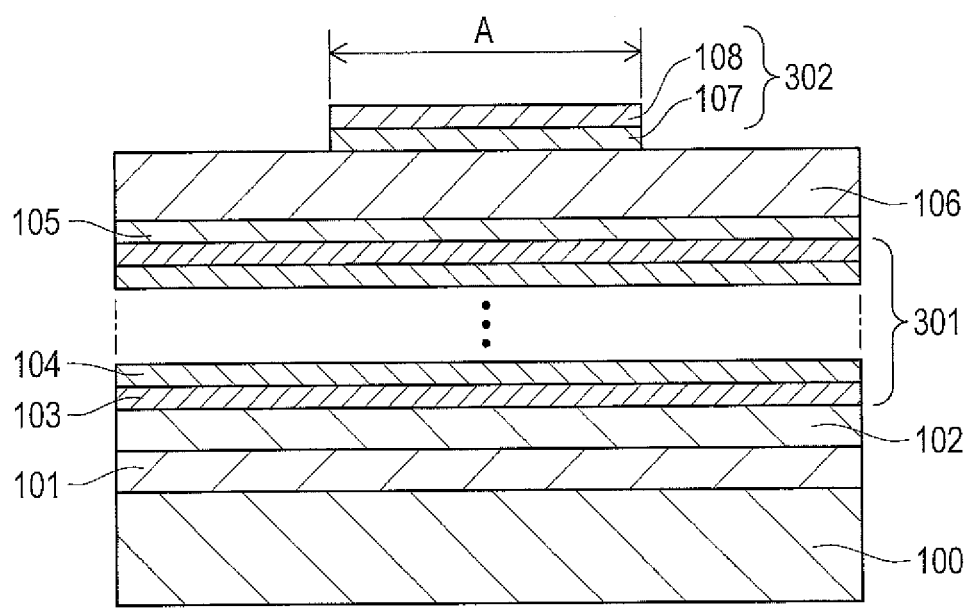
FIG. 2 is a view depicting a cross-sectional structure of the nitride-semiconductor light-emitting diode of the first embodiment in a second phase of the manufacturing process.
Figure 3:
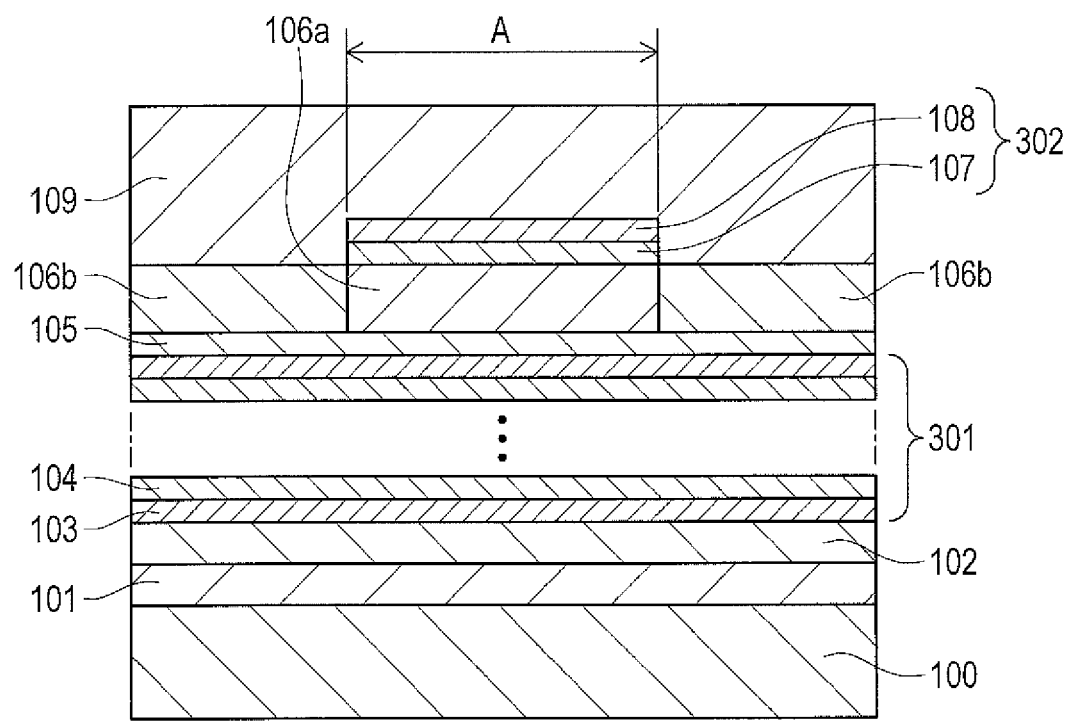
FIG. 3 is a view depicting a cross-sectional structure of the nitride-semiconductor light-emitting diode of the first embodiment in a third phase of the manufacturing process.
Figure 4:
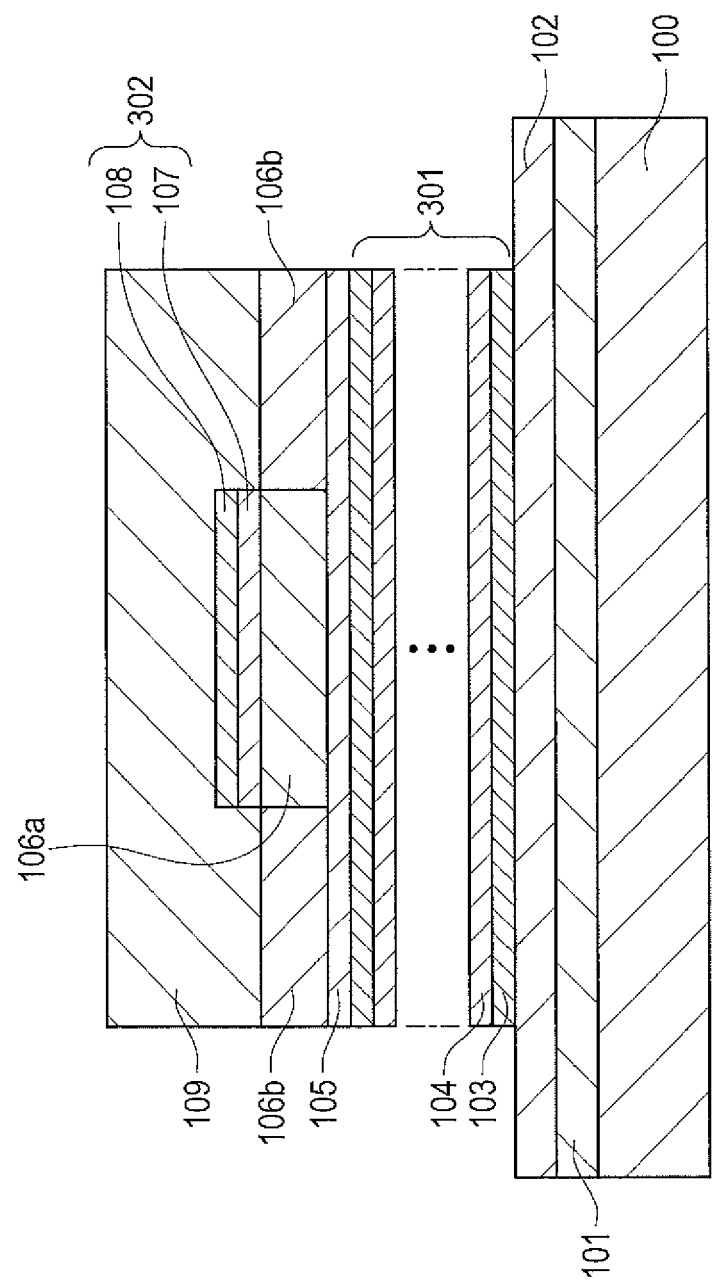
FIG. 4 is a view depicting a cross-sectional structure of the nitride-semiconductor light-emitting diode of the first embodiment in a fourth phase of the manufacturing process.

Next, the cross-sectional structure in the second phase of the manufacturing process depicted in FIG. 2 will be described. Film formation is once stopped, and the wafer is taken out of the reacting furnace. Etching is performed by a photolithographic technique and a dry etching technique or the like such that a region (hereinafter referred to as a current confinement region) A which is circular in planar view and which receives an injection current confined thereto and serves as a light-emitting region is left until the surface of the p-type GaN crystal layer 106 is exposed in a region outside the current confinement region. In the first embodiment, samples were fabricated in three diameters of the current confinement region A which are 10 μm, 15 μm, and 20 μm. The etching depth is approximately 50 nm. Thus, the current confinement region A is formed.

After that, two-stage thermal annealing is performed on the wafer. In first thermal annealing which is performed first, treatment is performed using, for example, oxygen gas as atmosphere gas under conditions in which annealing temperature is 725° C. and annealing time is 15 minutes. In second thermal annealing which is performed subsequent to the first thermal annealing, treatment is performed using, for example, ammonia gas as atmosphere gas under conditions in which annealing temperature is 700° C. and annealing time is 3 minutes.

The p-type GaN crystal layer 106 is formed by reacting TMGa, CP$_2$Mg, and ammonia gas as raw materials, using hydrogen gas as carrier gas. Moreover, Mg atoms are used as p-type impurities. In the course of film formation, hydrogen atoms may be produced by the decomposition of hydrogen gas as carrier gas or/and the reaction of raw material gases, and part of the produced hydrogen atoms is taken into the crystal. Since Mg atoms have the property of being easily combined with hydrogen atoms in the crystal, hydrogen atoms taken into the crystal are combined with Mg atoms. It is known that the hydrogen atoms combined with Mg atoms inhibits the Mg atoms from functioning as acceptor impurities to have p-type deactivation effect. It is known that by p-type deactivation of Mg atoms caused by hydrogen atoms, the crystal is prevented from exhibiting p-type conductivity and comes to have high resistance. As described below, an effective current confinement structure without a leakage current is formed by the first and second thermal annealing.

First, the first thermal annealing will be described. By the first thermal annealing, hydrogen atoms combined with Mg atoms as acceptors of the p-type GaN crystal layer 106 are removed from the Mg atoms throughout the entire region of the p-type GaN crystal layer 106 to be desorbed to the outside. This reduces the percentage of Mg atoms combined with hydrogen atoms to increase the number of activated Mg atoms. Acceptors are activated throughout the entire region of the p-type GaN crystal layer 106, and p-type conductivity is obtained with the ionization of Mg atoms. At this point of time, the resistance of the p-type GaN crystal layer 106 becomes low throughout the entire region thereof.

In this case, the surface of the p-type GaN crystal layer 106 is exposed to atmosphere gas in a region except for the current confinement region A, and hydrogen atoms can easily be desorbed from the wide exposed surface. This is because hydrogen atoms taken in during the film formation in the previous stage are considered to exist in a shallow region to a depth of, for example, approximately 0.1 μm from the exposed surface.

With regard to a portion of the p-type GaN crystal layer 106 which exists in a region corresponding to the current confinement region A, the tunnel junction layer 302 exists thereon, and the high-concentration n-type GaN crystal layer 108 is stacked thereon. Generally, it is known that hydrogen atoms cannot move through an n-type semiconductor. Accordingly, hydrogen atoms which exist in the p-type GaN crystal layer 106 and the high-concentration p-type GaInN crystal layer 107 to deactivate acceptors cannot be desorbed from the surface beyond the high-concentration n-type GaN crystal layer 108. Meanwhile, the p-type GaN crystal layer 106 and the high-concentration p-type GaInN crystal layer 107 have etched side walls exposed by etching for the formation of the current confinement region A. Thus, hydrogen existing in the current confinement region A moves to the outside of the current confinement region A in the substrate horizontal direction, not in the substrate vertical direction, and then exits from the etched side walls to the outside.

Since the diameter of the current confinement region A is approximately 10 to 20 μm, movement distance is longer compared to a depth of approximately 0.1 μm under the exposed surface. The treatment conditions (annealing temperature is 725° C., and annealing time is 15 minutes) for the first thermal annealing are conditions sufficient for allowing hydrogen atoms in the region corresponding to the current confinement region A as well as hydrogen atoms in the region except for the current confinement region A to exit to the outside.

In contrast, the second thermal annealing causes hydrogen atoms to be taken into the p-type GaN crystal layer 106 from the outside. Hydrogen atoms are taken in from the exposed surface of the p-type GaN crystal layer 106 which exists in the region except for the current confinement region A. In the treatment conditions (annealing temperature is 700° C., and annealing time is 3 minutes) for the second thermal annealing, annealing temperature is lower and annealing time is shorter than in the treatment conditions (annealing temperature is 725° C., and annealing time is 15 minutes) for the first thermal annealing. Thus, movement distances in the crystal of hydrogen atoms taken in from the exposed surface of the p-type GaN crystal layer 106 are shorter than in the first thermal annealing. Since the annealing conditions are mild, hydrogen atoms taken in from the etched side walls do not enter the p-type GaN crystal layer 106 or the like in the horizontal direction to spread into region corresponding to the current confinement region A, though hydrogen atoms are taken in from the exposed surface. In other words, hydrogen atoms can be selectively injected only into the region under the exposed surface. This increases the percentage of hydrogen atoms taken into the crystal and combined with Mg atoms, and inhibits a large number of Mg atoms from being activated. In the p-type GaN crystal layer 106 having the exposed surface, acceptors are deactivated to reduce the p-type conductivity.

Accordingly, hydrogen atoms are selectively taken into the region except for the current confinement region A, and the region corresponding to the current confinement region A is maintained in a state in which hydrogen atoms are desorbed. Thus, two regions are formed in the p-type GaN crystal layer 106. One is the region corresponding to the current confinement region A. In this region, Mg atoms have no hydrogen atoms combined therewith and are activated as acceptors, and an active p-type GaN crystal layer 106a having a low resistance value is formed (see FIG. 3). The other is the region except for the current confinement region A. In this region, hydrogen atoms are taken in from the exposed surface and combined with Mg atoms. Mg atoms are deactivated as acceptors, and an inactive p-type GaN crystal layer 106b having a high resistance value is formed (see FIG. 3).

As a result, the p-type GaN crystal layer 106 becomes the active p-type GaN crystal layer 106a having conductivity in the current confinement region A, and becomes the inactive p-type GaN crystal layer 106b having low conductivity in other regions. A structure can be obtained in which an injection current is efficiently concentrated in the current confinement region A to suppress a leakage current in other regions.

After that, as depicted in the cross-sectional structure (FIG. 3) in the third phase of the manufacturing process, SiH$_4$ gas, TMGa gas, and ammonia gas as raw material gases are fed into the reacting furnace to grow an n-type GaN crystal layer 109 to, for example, approximately 100 nm. The impurity concentration is set to, for example, approximately 5×10$^{18}$ cm$^{-3}$. Thus, the tunnel junction layer 302 is buried in the n-type GaN crystal layer 109 (second n-type nitrided compound layer).

Subsequently, as depicted in the cross-sectional structure (FIG. 4) in the fourth phase of the manufacturing process, the wafer is taken out of the reacting furnace, and etching is performed by a photolithographic technique and a dry etching technique or the like until the lower n-type GaN crystal layer 102 is exposed, thus forming a mesa shape which is centered at the current confinement region A and which has a mesa diameter of approximately 100 μm.

Then, a positive electrode 10 and a negative electrode 11 are formed. Using electrode materials such as Ti (titanium), Al (aluminum), and Au (gold), layers of Ti, Al, Ti, and Au are formed to be stacked in that order. The positive electrode 10 is formed on the n-type GaN crystal layer 109 in the shape of a ring in which the current confinement region A is contained inside and below. The negative electrode 11 is formed on the lower n-type GaN crystal layer 102 exposed by etching so as to surround the mesa shape. The n-type GaN crystal layer 109 constitutes a conducting path for guiding a current from the positive electrode 10 to the current confinement region A.

Figure 5:
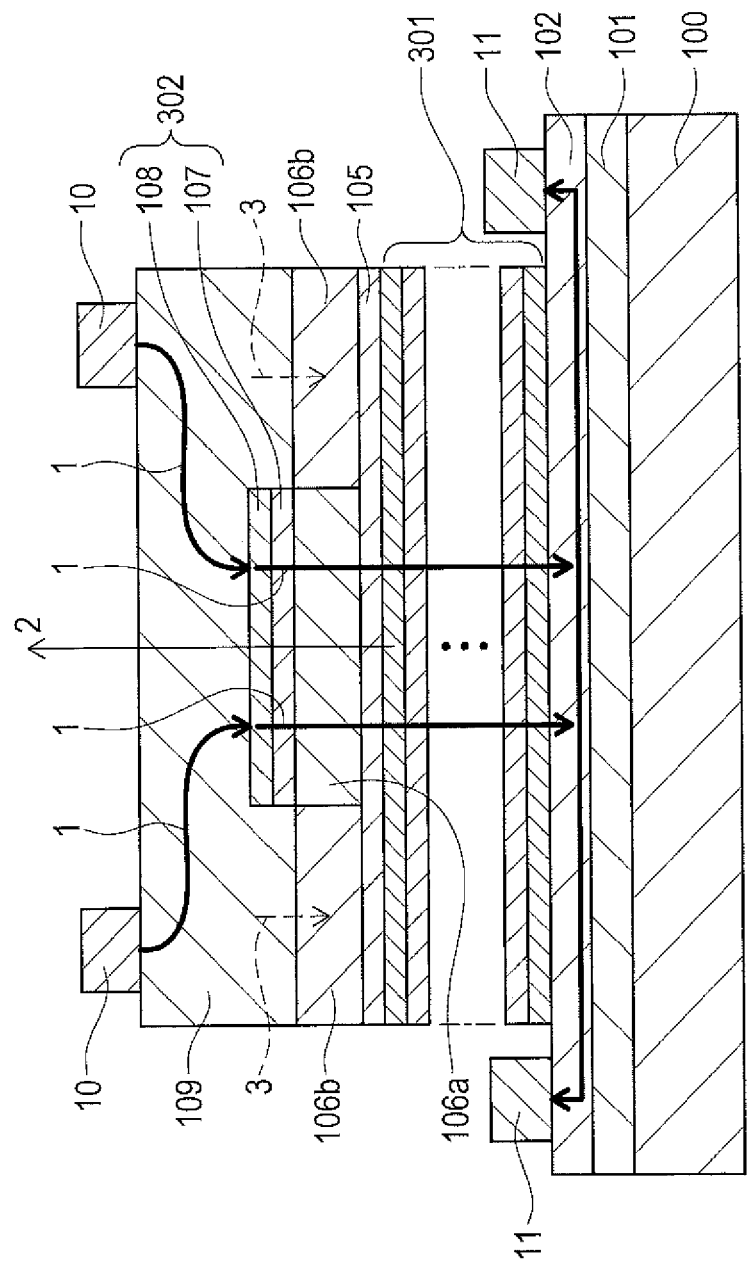
FIG. 5 is a view depicting a cross-sectional structure of the nitride-semiconductor light-emitting diode of the first embodiment.

Next, functions and effects of the current confinement structure in the nitride-semiconductor light-emitting diode manufactured by the manufacturing process of the first embodiment will be described. FIG. 5 depicts a cross-sectional structure of the nitride-semiconductor light-emitting diode. The same layers as those in FIGS. 1 to 4 are denoted by the same signs, and explanations thereof will be omitted here. The lower n-type GaN crystal layer 102 is a cladding layer, and is configured to have a larger band gap than the quantum well active layer 301 so that electrons can be supplied to the quantum well active layer 301. The quantum well active layer 301 has a structure in which the GaInN crystal layer 103 as a well layer and the GaN crystal layer 104 as a barrier layer are alternately stacked. The p-type AlGaN crystal layer 105 and the p-type GaN crystal layer 106 are cladding layers, and are configured to have larger band gaps than the quantum well active layer 301 so that holes can be supplied to the quantum well active layer 301.

By forming the current confinement structure including the current confinement region A described in FIGS. 1 to 4, a leakage current (arrows 3) which flows into a region directly under and outside the positive electrode 10 is effectively reduced, and a current injected from the positive electrode 10 is bent inward from the ring and confined in the current confinement region A (arrows 1) as the current flows down in the n-type GaN crystal layer 109. This is because of the following: in the region directly under and outside the positive electrode 10, a p-n junction is reversely biased through the inactive p-type GaN crystal layer 106b and the n-type GaN crystal layer 109, and a leakage current which flows in the reverse direction is very, small; whereas, inside the ring of the positive electrode 10, the tunnel junction layer 302 provides a low-resistance state in which a current is allowed to flow, even when the p-n junction is reversely biased. Another reason is as follows: in the former, the resistance of the inactive p-type GaN crystal layer 106b directly thereunder is high; whereas, in the latter, the resistance of the active p-type GaN crystal layer 106a directly thereunder is low. Thus, a current is confined in the quantum well active layer 301 located inside the ring, and light emission is concentrated in this region. Light emitted is not obstructed by the positive electrode 10, and exits to the outside inside the ring of the positive electrode 10 (arrow 2). Thus, light can be efficiently extracted.

In this case, a current path in which a path is bent from the positive electrode 10 to the current confinement region A is generally a crystal layer which is connected to the positive electrode 10 and which is of p-type, but can be the n-type GaN crystal layer 109 by providing the tunnel junction layer 302. With the n-type GaN crystal layer 109, the value of resistance can be reduced to approximately $1/100$ compared to that of the p-type GaN crystal layer, and the value of resistance in the current path can be reduced.

Thus, an injected current can be effectively passed into the current confinement region A by reducing to the minimum a portion of the injected current which is not used for light emission, and a favorable luminous efficacy can be obtained.

Figure 6:
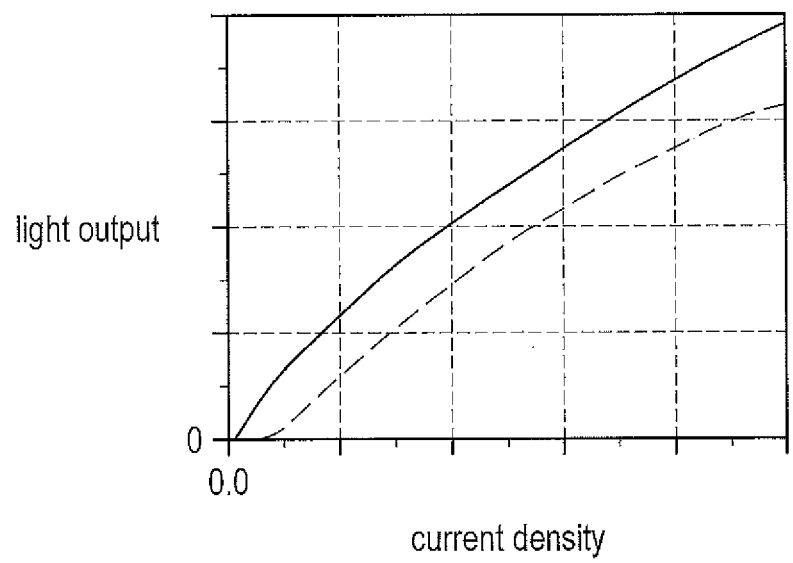
FIG. 6 depicts current-light output characteristics of the nitride-semiconductor light-emitting diode of the first embodiment.
Figure 7A:
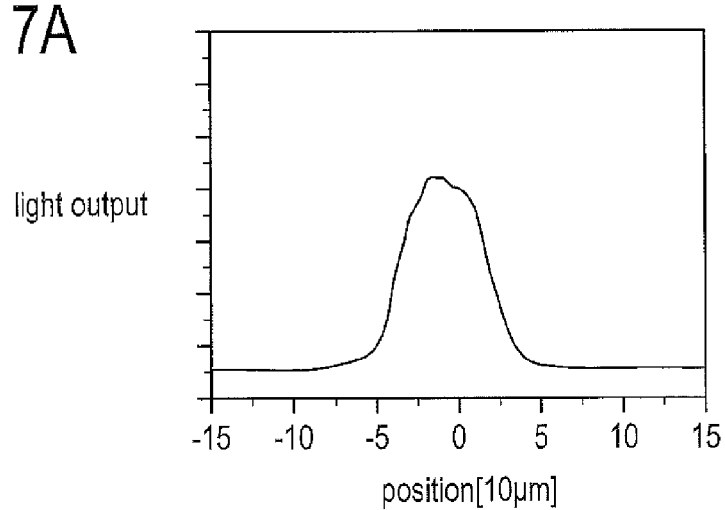
FIGS. 7A-7C depict numeric data on near-field images for the nitride-semiconductor light-emitting diode of the first embodiment.
Figure 7B:
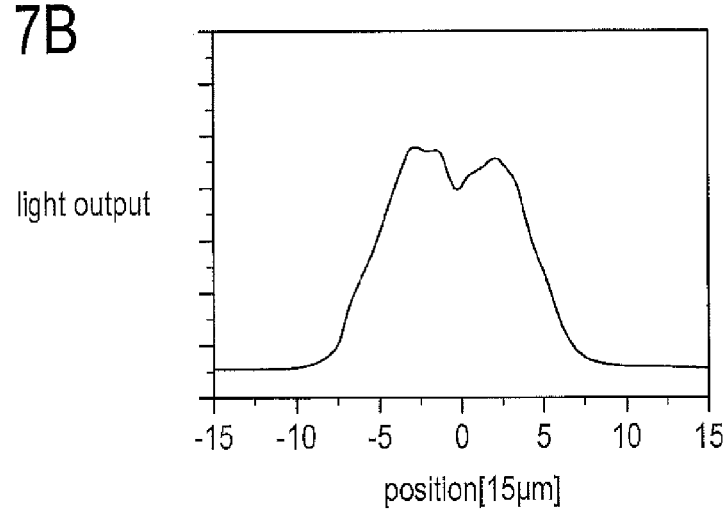
Figure 7C:
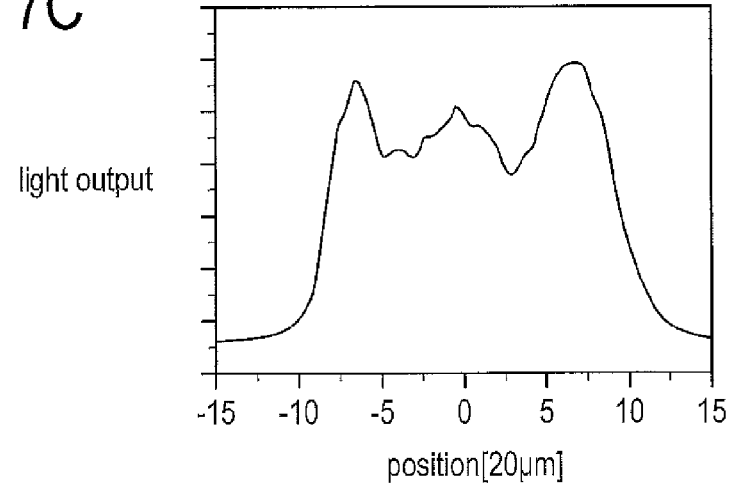

FIGS. 6 and 7 depict light-emitting characteristics of the nitride-semiconductor light-emitting diode of the first embodiment. FIG. 6 depicts current-light output characteristics for the case where a light-emitting region mesa diameter is 10 μm. The horizontal axis is current density, and the vertical axis is light output. Characteristics of the nitride-semiconductor light-emitting diode of the first embodiment are depicted by a solid line. Characteristics of a nitride-semiconductor light-emitting diode of a prior-art technique are depicted by a broken line for reference. It is indicated that the nitride-semiconductor light-emitting diode of the prior-art technique exhibits little light output in a low-current-density region. Meanwhile, the nitride-semiconductor light-emitting diode of the first embodiment exhibits favorable light output even in a low-current-density region. Moreover, it is indicated that in the entire current-density region, the nitride-semiconductor light-emitting diode of the first embodiment has characteristics superior to those of the nitride-semiconductor light-emitting diode of the prior-art technique, and has an improved luminous efficacy compared to the prior art technique.

FIG. 7 depicts numeric data on near-field images for nitride-semiconductor light-emitting diode samples having light-emitting region mesa diameters of 10 μm, 15 μm, and 20 μm. The horizontal axis is position with reference to a center of the mesa shape, and the vertical axis is light output. It can be seen that effective light emission with diameters approximately equal to the sizes of the mesa diameters is achieved.

Figure 8:
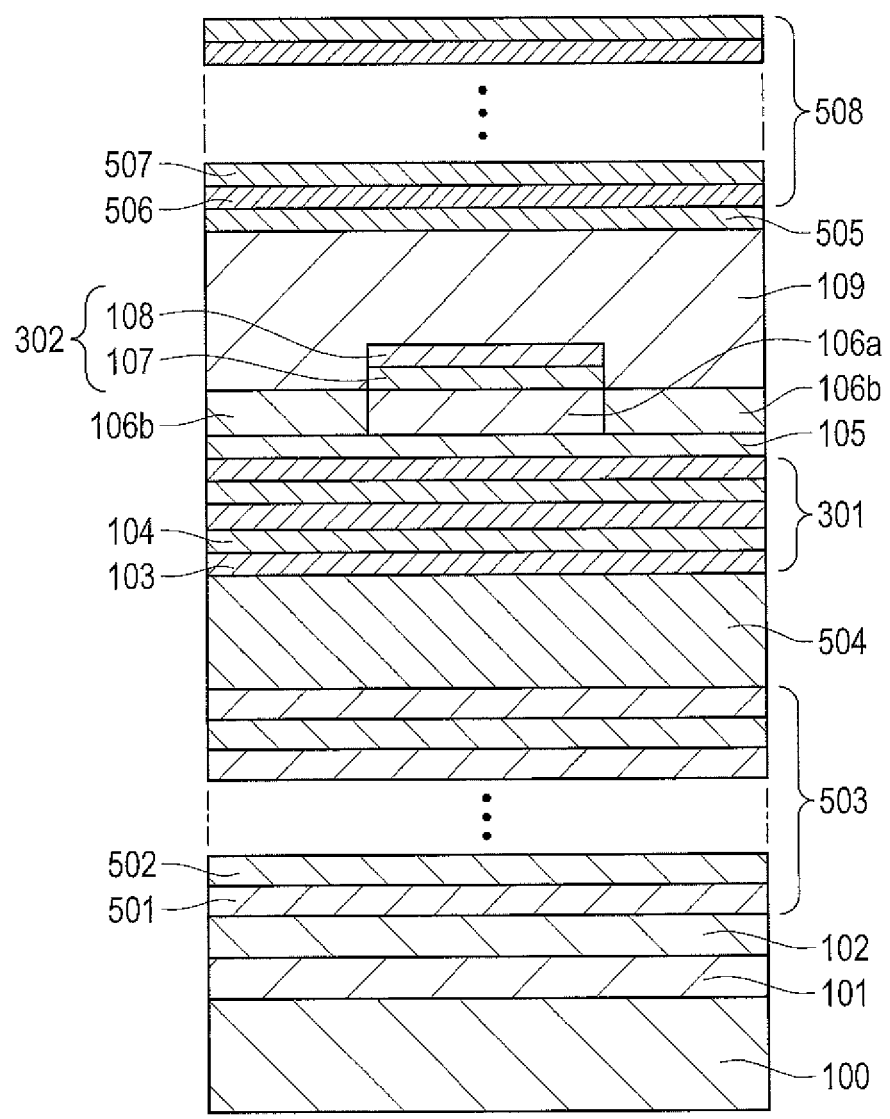
FIG. 8 is a view depicting a cross-sectional structure of a second embodiment.

In the second embodiment, a surface-emitting laser including a nitride-semiconductor multi-layer reflector will be illustrated using the manufacturing process of the first embodiment. FIG. 8 depicts a cross-sectional structure of the surface-emitting laser. Hereinafter, the manufacturing process will be described. First, as in the case of the nitride-semiconductor light-emitting diode of the first embodiment (FIGS. 1 to 4), the undoped GaN crystal layer 101 and the lower n-type GaN crystal layer 102 are stacked on the GaN crystal substrate 100 in that order.

Then, a nitride-semiconductor multi-layer reflector layer 503 is stacked on the lower n-type GaN crystal layer 102. This is a nitride-semiconductor multi-layer reflector layer having a center reflection wavelength of approximately 410 nm. The substrate temperature, i.e., the growth temperature, is set to 815° C., and ammonia gas, TMAl, and TMIn as raw materials are fed into the reacting furnace with nitrogen gas as carrier gas. Thus, an AlInN crystal layer 501 is stacked on the lower n-type GaN crystal layer 102. At this time, the mole fraction of In atoms in the AlInN crystal layer 501 is approximately 18%. The thickness of the AlInN crystal layer 501 is approximately 50 nm. Specifically, growth is performed to a ¼-wavelength optical film thickness for the center reflection wavelength 410 nm. Subsequently, TMGa is fed into the reacting furnace with the substrate temperature maintained at 815° C. to stack a GaN crystal layer of approximately 10 nm on the AlInN crystal layer 501. After that, the feeding of TMGa gas is once stopped to interrupt the crystal growth. Then, the substrate temperature is increased to 1050° C., and TMGa is fed again to grow a GaN crystal layer to approximately 30 nm. Thus, a GaN crystal layer 502 having the ¼-wavelength optical film thickness for the center reflection wavelength 410 nm is stacked. The AlInN crystal layer 501 and the GaN crystal layer 502 are alternately stacked to 40.5 pairs to form the nitride-semiconductor multi-layer reflector layer 503 on the lower n-type GaN crystal layer 102.

An n-type GaN crystal layer 504 of approximately 1000 nm is grown on the nitride-semiconductor multi-layer reflector layer 503. As raw material gas for n-type impurities, $SiH_4$ (silane) gas is used. The n-type GaN crystal layer 504 is doped with Si atoms as n-type impurities to a concentration of approximately $1 \times 10^{19}$ $cm^{-3}$. After that, a quantum well active layer 301 is formed on the n-type GaN crystal layer 504. The quantum well active layer 301 is stacked by a manufacturing process similar to that of the nitride-semiconductor light-emitting diode of the first embodiment (FIGS. 1 to 4), but the film thickness of each layer and the number of stacked pairs are different from those of the first embodiment. For example, 2.5 pairs of layers are stacked, each pair including the GaInN crystal layer 103 of approximately 3 nm and the GaN crystal layer 104 of approximately 6 nm. Moreover, the mole fraction of In atoms is set to approximately 0.10. Thus, the emission of light with wavelengths from 405 to 410 nm is achieved. The p-type AlGaN crystal layer 105, the p-type GaN crystal layer 106, and the high-concentration p-type GaInN crystal layer 107 and the high-concentration n-type GaN crystal layer 108 constituting the tunnel junction layer 302 are stacked on the quantum well active layer 301 in that order as in the nitride-semiconductor light-emitting diode of the first embodiment (FIGS. 1 to 4).

After that, the following are performed as in the first embodiment: etching the region outside the current confinement region A by a photolithographic technique and a dry etching technique or the like such that the current confinement region A is left until the p-type GaN crystal layer 106 is exposed; performing two-stage thermal annealing to form the p-type GaN crystal layer 106 into two regions, which are the active p-type GaN crystal layer 106a with low resistance in the region corresponding to the current confinement region A and the inactive p-type GaN crystal layer 106b with high resistance in the region except for the current confinement region A; and burying these structures in the n-type GaN crystal layer 109.

Subsequently, positive and negative electrodes for injecting a current are formed as follows. First, a mesa with a diameter of approximately 50 μm centered at the current confinement region A is formed by a publicly known photolithography and dry etching process (not depicted). At this time, dry etching is performed until the surface of the n-type GaN crystal layer 504 is exposed in a region except for the mesa. Then, a $SiO_2$ film 505 is deposited on the entire surface of the wafer to approximately 20 nm by vapor deposition or sputtering. At this time, a ring-shaped opening portion is formed in the $SiO_2$ film 505 by lift-off so as to surround the current confinement region A on the mesa (not depicted). Moreover, a ring-shaped opening portion is formed in the $SiO_2$ film 505 in a peripheral portion of the mesa on the n-type GaN crystal layer 504 (not depicted). A positive electrode and a negative electrode are formed in the respective opening portions.

Finally, a dielectric multi-layer reflector layer 508 with a center reflection wavelength of approximately 410 nm including eight pairs of a $SiO_2$ layer 506/a $ZrO_2$ layer 507 is stacked on the positive electrode. Thus, a blue-violet nitride-semiconductor surface-emitting laser which emits light with wavelengths from 405 to 410 nm is fabricated.

The tunnel junction layer 302 is one example of a buried tunnel junction layer. The p-type GaN crystal layer 106 is one example of a p-type nitrided compound layer. Removing hydrogen atoms combined with Mg atoms as acceptors of the p-type GaN crystal layer 106 from the Mg atoms and desorbing the hydrogen atoms to the outside to allow Mg atoms to function as acceptors is one example of p-type activation. Meanwhile, causing hydrogen atoms to be taken into the p-type GaN crystal layer 106 from the outside and combined with Mg atoms to inhibit Mg atoms from functioning as acceptor impurities is one example of p-type deactivation. The n-type GaN crystal layer 109 is one example of an n-type nitrided compound layer.

As described in detail above, according to the first embodiment of the technique disclosed in the present application, the first and second thermal annealing is performed prior to burying the tunnel junction layer 302 in the n-type GaN crystal layer 109. The two-stage thermal annealing performed in an intermediate stage of the manufacturing process in which the p-type GaN crystal layer 106 is exposed to atmosphere gas with the tunnel junction layer 302 partially removed, controls the level of abundance of hydrogen atoms in the crystal to control the activation and deactivation of the p-type GaN crystal layer 106. Thus, the p-type GaN crystal layer 106 is activated in the region directly under the tunnel junction layer 302 to become the active p-type GaN crystal layer 106a with low resistance and is deactivated in other regions to become the inactive p-type GaN crystal layer 106b with high resistance. The p-type GaN crystal layer 106 can be divided into two regions, which are the active p-type GaN crystal layer 106a and the inactive p-type GaN crystal layer 106b. A current can be efficiently confined in the current confinement region A while a leakage current outside the current confinement region A is being suppressed.

Moreover, in the manufacturing process of the surface-emitting laser of the second embodiment, as in the first embodiment, two-stage thermal annealing is performed in an intermediate stage of the manufacturing process. Thus, with regard to a current injected for light emission, a leakage current outside the current confinement region A is reduced, and a current can be efficiently passed through the current confinement region A. A blue-violet surface-emitting laser having a favorable luminous efficacy can be fabricated.

It should be noted that, of course, the technique disclosed in the present application is not limited to the aforementioned embodiments, and various modifications and changes can be made without departing from the spirit.

For example, the embodiments have been described by illustrating the case where the division of the p-type GaN crystal layer 106 into the active p-type GaN crystal layer 106a with low resistance and the inactive p-type GaN crystal layer 106b with high resistance is realized by performing two-stage thermal annealing including the first thermal annealing and the second thermal annealing.

However, the present application is not limited to this. The formation of the n-type GaN crystal layer 109, which is a manufacturing step following the thermal annealing, may be used as the second thermal annealing. The formation of the n-type GaN crystal layer 109 is performed by using $SiH_4$ gas, TMGa, and ammonia gas as raw materials. Accordingly, hydrogen atoms may be produced in the atmosphere by a chemical reaction of raw materials. Moreover, hydrogen atoms can also be produced in the atmosphere by using hydrogen gas as carrier gas for transporting raw materials. The formation of the n-type GaN crystal layer 109 in the presence of hydrogen atoms such as described above allows film formation conditions to be adjusted so that hydrogen atoms may be sufficiently taken into the exposed surface of the p-type GaN crystal layer 106 in a phase prior to the film formation or in an early phase of the film formation which is a waiting period before the temperature and the gas stream are stabilized. Thus, thermal annealing only needs to include single-stage treatment of the first thermal annealing, and the manufacturing process can be simplified.

Moreover, in the first embodiment, the case where a GaN crystal layer is formed on a sapphire substrate as the GaN crystal substrate 100 with a low-temperature-deposited buffer layer interposed therebetween has been described. However, the present application is not limited to this. A free-standing GaN crystal substrate, a substrate having a GaN crystal deposited on SIC, a substrate having a GaN crystal deposited on ZnO, an AlN substrate, or the like may be used.

Moreover, a description has been made by illustrating a three-element alloy crystal layer of GaInN, AlGaN, GaInN, AlInN, or the like other than a GaN crystal layer as a nitride semiconductor crystal layer constituting each layer, but the present application is not limited to this. Other multi-element alloy may be employed. For example, a four-element alloy such as an AlGaInN crystal layer or an AlInBN crystal layer or a five-element alloy such as an AlGaInBN crystal layer may be employed.

Moreover, the case where a nitride semiconductor multi-element alloy is deposited by MOCVD has been described, but the present application is not limited to this. For example, film formation may be performed by HVPE (hydride vapor phase epitaxy), MBE (molecular beam epitaxy), sputtering, or the like.

Moreover, in the present application, the second embodiment has been described as an application by illustrating a blue-violet surface-emitting laser, but the present application is not limited to this. For example, the present application can also be applied to other light-emitting devices and other electronic devices such as a HEMT (high electron mobility transistor) using a GaN/AlInN heterojunction structure.

Moreover, the case where TMAl or TMIn is used as a raw material gas for a group III element has been described, but the present application is not limited to this. For example, TEAl (triethylaluminum), TEIn (triethylindium), or the like may be used.

Moreover, the case where film formation is performed using ammonia as a raw material gas for N has been described, but the present application is not limited to this. Nitrogen gas or other nitrogen compound may be used.

Moreover, in the present application, a description has been made by illustrating the case where Mg atoms are used as acceptor impurities, but the present application is not limited to this. Atoms of Zn, Be, Ca, Sr, Ba, or the like may be used. Further, a description has been made by illustrating the case where Si atoms are used as donor impurities, but the present application is not limited to this. Atoms of Ge or the like may be used.

Moreover, the case where the lower n-type GaN crystal layer 102 is stacked on the undoped GaN crystal layer 101 as a GaN crystal has been described, but the present application is not limited to this. For example, a configuration without the lower n-type GaN crystal layer 102 is possible.

Moreover, the nitride semiconductor multi-element alloy has been deposited to be oriented with the +c axis, but is not limited to this, and may be deposited to be oriented with other crystal axis such as the a axis or the m axis.

Moreover, for the formation of each nitride semiconductor crystal layer according to the technique of the present application, the growth temperature and other growth conditions, the growth thickness of each crystal layer, the number of stacked layers, the number of pairs of stacked layers, and the like are not limited to those of the embodiments, and it is a matter of course that various changes can be made.

The following description is the list of aspects of the embodiments of the present application.

Before the buried tunnel junction layer is buried in the second n-type nitrided compound layer, the p-type activation of the p-type nitrided compound layer stacked below the buried tunnel junction layer is performed. In this case, p-type activation is performed throughout the entire region of the p-type nitrided compound layer including the region directly under the buried tunnel junction layer.

Conditions for p-type activation are different between the p-type nitrided compound layer in the region directly under the buried tunnel junction layer and the p-type nitrided compound layer outside the region directly under the buried tunnel junction layer. In this phase of manufacture, while an upper layer of the p-type nitrided compound layer in the region directly under the buried tunnel junction layer is covered with the buried tunnel junction layer including the first n-type nitrided compound layer, the p-type nitrided compound layer outside the region directly under the buried tunnel junction layer has a surface exposed to atmosphere gas by the removing of the buried tunnel junction layer. Accordingly, in the latter, p-type activation is easier than in the former, and specifically p-type activation is performed in a shorter time. In the p-type activation, p-type activation is performed in a state in which the p-type nitrided compound layer outside the region directly under the buried tunnel junction layer has a surface exposed to the atmosphere gas. In addition to p-type activation in a region other than the region directly under the buried tunnel junction layer, p-type activation in the region directly thereunder is also performed. Thus, p-type activation is performed throughout the entire region of the p-type nitrided compound layer.

Further, between the p-type activation of the p-type nitrided compound layer and the burying of the buried tunnel junction layer, p-type deactivation may be performed on the p-type nitrided compound layer except for the region directly under the buried tunnel junction layer.

Further, the p-type activation of the p-type nitrided compound layer may be performed to include first thermal annealing, and the p-type deactivation of the p-type nitrided compound layer may be performed to include second thermal annealing. In this case, the first thermal annealing is performed under conditions including a higher treatment temperature or a longer treatment time or both than the second thermal annealing.

Moreover, the burying of the buried tunnel junction layer performed after the p-type activation may be performed in a state in which hydrogen atoms exist in the atmosphere gas or a raw material. Hydrogen atoms existing in the atmosphere gas or a raw material are fed by using hydrogen gas as a raw material gas or carrier gas for transporting raw materials, or are fed by being produced by a chemical reaction of a raw material gas or a raw material.

Explanation of Reference Signs

In the method of manufacturing an n-p-n nitride-semiconductor light-emitting device according to the technique disclosed in the present application, the p-type activation is performed in an intermediate phase of the manufacturing process in which the p-type nitrided compound layer is exposed to atmosphere gas with the buried tunnel junction layer partially removed. Since the p-type nitrided compound layer is exposed, p-type activation can be efficiently performed. The p-type activation of the p-type nitrided compound layer is achieved, and a p-type nitrided compound layer with low electric resistance can be efficiently obtained.

Here, p-type activation means that acceptor impurities are activated in a p-type semiconductor crystal layer. This causes the p-type semiconductor crystal layer to exhibit p-type conductivity and lowers the electric resistance thereof. In contrast, p-type deactivation means that acceptor impurities are deactivated in a p-type semiconductor crystal layer. This lowers the conductivity of the p-type semiconductor crystal layer and increases the electric resistance thereof.

Further, with the above-described p-type deactivation, the p-type deactivation of a region of the p-type nitrided compound layer except for the region directly under buried tunnel junction layer is effectively performed. In the region of the p-type nitrided compound layer except for the region directly under the buried tunnel junction layer, the surface is exposed to the atmosphere gas, and p-type deactivation can therefore be easily achieved. Meanwhile, the p-type nitrided compound layer in the region directly under the buried tunnel junction layer is covered with the buried tunnel junction layer, and therefore the p-type deactivation thereof cannot be easily achieved. The p-type deactivation of a region of the p-type nitrided compound layer having an exposed surface can be preferentially achieved. Thus, the region directly under the buried tunnel junction layer is maintained in a state in which p-type activation is achieved, and is maintained as a region with low electric resistance. Meanwhile, the region except for the region directly under the buried tunnel junction layer is subjected to p-type deactivation to become a region with high electric resistance. The region directly under the buried tunnel junction layer can be selectively made a low-resistance region, and other region can be made a high-resistance region. A leakage current in the region except for the region directly under the buried tunnel junction layer can be suppressed to cause a current to be concentrated in the region directly under the buried tunnel junction layer. Thus, a current can be effectively confined.

In thermal annealing, the distance of a region in the p-type nitrided compound layer from the exposed surface in which p-type activation/deactivation can be achieved increases with increasing treatment temperature or increasing treatment time or both. By performing the p-type activation under conditions including a higher treatment temperature or a longer treatment time or both, the p-type activation of the entire surface of the p-type nitrided compound layer including the region directly under the buried tunnel junction layer can be achieved. Meanwhile, by performing the above-described p-type deactivation under conditions including a lower treatment temperature or a shorter treatment time or both, the p-type deactivation of the p-type nitrided compound layer having an exposed surface except for the region directly under the buried tunnel junction layer can be achieved.

For example, a state in which p-type activation is achieved is a state in which hydrogen atoms are desorbed from the crystal, the number of hydrogen atoms existing in the crystal decreases, and acceptor impurities are activated. Meanwhile, a state in which p-type deactivation is achieved is a state in which hydrogen atoms are taken into the crystal, hydrogen atoms exist in the crystal, and acceptor impurities are not activated. For the p-type nitrided compound layer in the region directly under the buried tunnel junction layer, the introduction of hydrogen atoms is prevented because the buried tunnel junction layer includes the first n-type nitrided compound layer. Thus, p-type deactivation cannot be easily achieved. In contrast, in the region except for the region directly under the buried tunnel junction layer, the p-type nitrided compound layer is exposed on the surface, and the n-type nitrided compound layer which prevents the introduction of hydrogen atoms is not interposed. Accordingly, the p-type deactivation of this region can be preferentially achieved.

Moreover, since the burying performed after the p-type activation is performed in a state in which hydrogen atoms exist in the atmosphere gas or a raw material, hydrogen atoms can be injected into the exposed surface of the p-type nitrided compound layer during a time before embedded growth starts. The time before embedded growth starts is a preparation time prior to the start of a growth reaction, such as a time for changing the temperature of the atmosphere to a set temperature for the embedded growth, a time for replacing the atmosphere gas, or a time before a raw material gas, a raw material stream, or the like is stabilized. It is known that the fewer the hydrogen atoms exist in the crystal, the further the p-type activation proceeds; and the more the hydrogen atoms exist in the crystal, the further the p-type deactivation proceeds. In the burying, since hydrogen atoms exist in the atmosphere gas, hydrogen atoms are taken into the crystal, and p-type deactivation is achieved.

Moreover, in the n-p-n nitride-semiconductor light-emitting device according to the technique disclosed in the present application, when the electric resistance of the p-type nitrided compound layer is compared between the region directly under the buried tunnel junction layer and the region except for the region directly thereunder, the former has a lower resistance, and the latter has a higher resistance. A leakage current is reduced in the p-type nitrided compound layer except for the region directly under the buried tunnel junction layer, and a current confinement structure can be efficiently configured in the region corresponding to the buried tunnel junction layer.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

The invention claimed is:

1. A method of manufacturing a nitride-semiconductor light-emitting device, the method comprising:
   stacking a buried tunnel junction layer above a first p-type nitrided compound layer that is stacked above an active layer, the buried tunnel junction layer is formed as a second p-type nitrided compound layer and a first n-type compound layer stacked in this order;
   removing the buried tunnel junction layer while a region through which the current flows to the active layer is being left;
   wherein the removing of the buried tunnel junction layer forms a first region of the first p-type nitrided compound layer with an exposed surface and a second region of the first p-type nitrided compound layer directly under the buried tunnel junction layer which is left;
   performing p-type activation on the second region of the first p-type nitrided compound layer using the exposed surface of the first p-type nitrided compound layer in the first region; and
   stacking a second n-type nitrided compound layer above the buried tunnel junction layer and the first p-type nitrided compound layer to bury the buried tunnel junction layer.

2. The method according to claim 1, further comprising, between the performing p-type activation on the second region of the first p-type nitrided compound layer and the stacking the second n-type nitrided compound layer, performing p-type deactivation on the first region of the first p-type nitrided compound layer.

3. The method according to claim 2, wherein
   the performing p-type activation on the second region of the first p-type nitrided compound layer includes first thermal annealing,
   the performing p-type deactivation on the first region of the first p-type nitrided compound layer includes second thermal annealing, and
   the first thermal annealing is performed under conditions including a higher treatment temperature or a longer treatment time or both than the second thermal annealing.

4. The method according to claim 1, wherein in the stacking of the second n-type nitrided compound layer, hydrogen atoms exist in atmosphere gas or a raw material.

5. The method according to claim 4, wherein the hydrogen atoms in the atmosphere gas are fed by using hydrogen gas as carrier gas for transporting the raw material or by being produced by a chemical reaction of the raw material.

* * * * *